(12) United States Patent
Tsai

(10) Patent No.: US 6,380,633 B1
(45) Date of Patent: Apr. 30, 2002

(54) PATTERN LAYOUT STRUCTURE IN SUBSTRATE

(75) Inventor: Ying Chou Tsai, Taichung (TW)

(73) Assignee: Siliconware Predision Industries Co., Ltd., Taichung Hsien (TW)

( * ) Notice: Subject to any disclaimer, the term of this patent is extended or adjusted under 35 U.S.C. 154(b) by 9 days.

(21) Appl. No.: 09/610,055

(22) Filed: Jul. 5, 2000

(51) Int. Cl.⁷ .............................................. H01L 23/48
(52) U.S. Cl. ...................... 257/778; 257/690
(58) Field of Search ................ 257/698, 738, 257/683, 690, 737, 739, 778, 779, 781; 438/623, 123; 361/760

(56) References Cited

U.S. PATENT DOCUMENTS

| | | | | |
|---|---|---|---|---|
| 5,886,406 A | * | 3/1999 | Bhansali | 257/698 |
| 6,165,892 A | * | 12/2000 | Chazan et al. | 438/623 |
| 6,171,888 B1 | * | 1/2001 | Lynch et al. | 438/123 |
| 6,198,635 B1 | * | 3/2001 | Shenoy et al. | 361/760 |
| 6,128,731 A1 | * | 4/2001 | Huang et al. | 257/738 |
| 6,225,687 B1 | * | 5/2001 | Wood | 257/683 |
| 6,246,112 B1 | * | 6/2001 | Ball et al. | 257/690 |

* cited by examiner

*Primary Examiner*—David Nelms
*Assistant Examiner*—Bau T Le
(74) *Attorney, Agent, or Firm*—J. C. Patents

(57) ABSTRACT

A pattern layout structure of package substrate includes a plurality of patterned circuit layers alternately stacking up with at least an insulative layer for isolating the patterned circuit layers wherein the patterned circuit layers are electrically connected each other. The feature of the pattern layout is that the patterned circuit layer includes a signal circuit region, a power/ground region, and a dummy circuit region. The signal circuit region includes a multiplicity of conductive traces, and the power/ground region includes a first grid-like pattern while the dummy circuit region includes a second grid-like pattern. The pitch of either the first or second grid patterns is equal to the pitch of the conductive traces.

12 Claims, 4 Drawing Sheets

PATTERN LAYOUT STRUCTURE IN SUBSTRATE

BACKGROUND OF THE INVENTION

1. Field of the Invention

This invention relates to a pattern layout structure in substrate, and more particularly to a pattern layout structure in substrate that makes use of grid dummy pattern structure to improve the planarity and quality of the built-up substrate.

2. Description of Related Art

In the course of the development of the IC package technology, since the integration of the semiconductor is increasing and the chip design gradually tends toward functional integration, a lot of SOC (System On Chip) products are produced one after another. As a result, following the enhancement of the data processing capability, the numbers of the I/O (input/output) terminals required by the chip are getting more and more, and the size of the chip is increasing. Accordingly, in recent years, the number of IC package product having high density and high pin (or lead) count is increasing day by day.

Among the IC package products having high density and high pin (lead) count, the substrate type carrier is a package element frequently used. The substrate type carrier mainly includes two categories, that is, the pressed laminate type and the built-up type. As far as the flip chip substrate is concerned, the built-up substrate is the main stream of application. Generally, the built-up substrate is made by forming a multiplicity of insulative layers and patterned copper foil layers on the surface of the insulative core layer of the substrate wherein the insulative layer is formed by coating, and the material employed includes Epoxy, Polyimide etc. Since the insulative layer is formed by coating, the planarity of the copper foil layer on the top of the insulative layer is hard to be controlled. The non-controllable planarity of the copper foil layer will affect the photolithographic and etching quality of the copper foil layer, thereby, will lower the quality of the substrate, and in the mean time, will make the subsequent packaging process more difficult. Besides, in the light of the trend of the development of the semiconductor device, the required number of terminals of the substrate is gradually increased, so is the layout density and area of the substrate. Accordingly, the stress between layers becomes relatively large such that the manufacturing process of the substrate becomes relatively difficult.

FIG. 1 is a plan view of the patterned circuit layer according to a prior art. In the prior art technology, either the planarity of the copper foil layer or the stress between layers is closely related to the circuit layout of the copper foil layer. As shown in FIG. 1, the patterned circuit layer 102 in the built-up substrate 100 is formed by the use of a copper foil layer defined by the photolithographic and etching processes. The pattern layout includes a signal circuit region 104, a power/ground region 108, and the other region. The signal circuit region 104 has a multiplicity of conductive traces 106 disposed for signal transmission while the power/ground region 108 is for connecting to the power source and the ground. The other region of the copper layer is for forming dummy pattern region 110 for dissipating heat and avoiding electromagnetic interference.

FIG. 2 is the enlarged drawing of the power/ground and the dummy pattern region corresponding to those in FIG. 1 according to the prior art. As shown in FIG. 2, the conventional power/ground region 108 and the dummy pattern region 110 are all constituted by a whole piece of copper foil with several ventilating holes 112 disposed thereon. As far as the current flip chip package substrate is concerned, the width of the conductive trace is around 40 $\mu$m, and the pitch is around 50~100 $\mu$m. Therefore, the fact that there is an obvious difference between the pattern density of the signal circuit region and that of the power/ground or the dummy pattern region will result in a non-uniform thickness in the subsequent process of coating the insulative layer. Accordingly, the planarity of the patterned circuit layer becomes worse. This will affect the quality of the substrate, and the planarity of the substrate will affect the yield of the subsequent packaging process. In addition, the copper foil pattern having relatively large area will result in a relatively high stress concentration, thereby, will lower the reliability of the substrate.

SUMMARY OF THE INVENTION

Therefore, it is one of the objectives of the present invention to provide a pattern layout structure of a substrate to make the pattern density uniform and to improve the planarity of the patterned circuit layer in the substrate.

It is another objective of the present invention to provide a pattern layout structure of a substrate that makes use of a grid pattern design to avoid the stress concentration so as to improve the quality and reliability of the substrate.

In order to attain the foregoing and other objectives, the present invention provides a pattern layout structure for package substrate. The pattern layout structure for package substrate includes a plurality of patterned circuit layers alternately stacking up with at least an insulative layer for isolating the patterned circuit layers, wherein the patterned circuit layers are electrically connected to one another. The feature of the pattern layout is that the patterned circuit layer includes a signal circuit region, a power/ground region, and a dummy circuit region. The signal circuit region includes a multiplicity of conductive traces, and the power/ground region includes a first grid pattern while the dummy circuit region includes a second grid pattern. The first and second grid patterns are comprised of a plurality of first and second interlaced dummy traces, respectively. The pitch and the width of the first and second dummy traces are substantially equal to the pitch and the width of the conductive traces.

According to a preferred embodiment of the present invention, the patterned circuit layer is formed by the use of a copper foil layer through the processes defined by a photolithographic and etching process. Also, the first grid circuit and the second grid circuit include a grid circuit having 45-degree angle of inclination.

BRIEF DESCRIPTION OF DRAWINGS

The foregoing and other objectives, characteristics, and advantages of the present invention can be more fully understood by reading the following detailed description of the preferred embodiments, with reference made to the accompanying drawings as follows.

DETAILED DESCRIPTION OF PREFERRED EMBODIMENT

Figure 3:
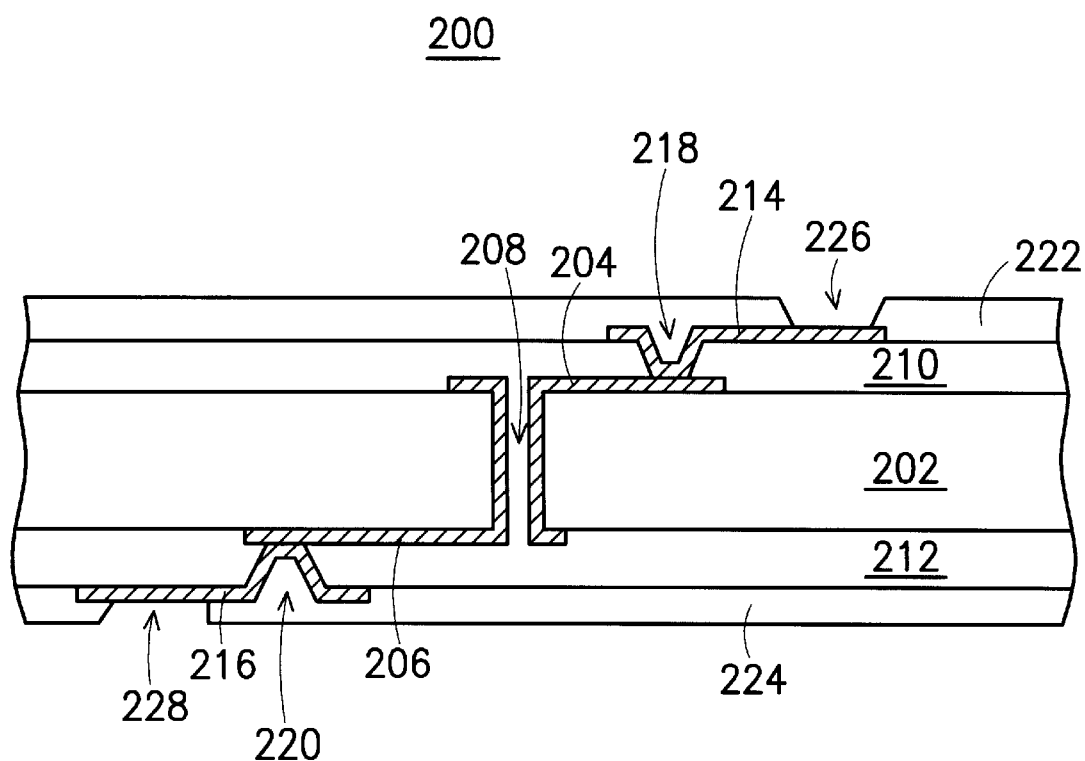
FIG. 3 is a cross-sectional view of a package substrate structure according to a preferred embodiment of the present invention.

FIG. 3 is a cross-sectional view of a package substrate structure according to a preferred embodiment of the present invention. The preferred embodiment takes a built-up flip chip package having 4 layers as an example. That is, the patterned circuit layer constituted by a pair of copper foil layers positioned on each of the two sides of the insulative core layer and another pair of copper foil layers built up above and below the surfaces thereof respectively to become a 1+2+1 layer type of structure. As shown in FIG. 3, a package substrate 200 such as a flip chip BGA (Ball Grid Array) package of the preferred embodiment includes an insulative layers 202 made of "flame-retardant epoxy-glass fabric composite resin"(FR-4, FR-5) or Bismaleimide-Taiazine (BT) etc. A pair of patterned circuit layers 204 and 206 is formed on each of the two surfaces of the insulative core layer 202 respectively through the definition of photo-lithographic and etching process performing on a copper foil layer. The patterned circuit layers 204 and 206 are electrically connected through a via 208 in the insulative core layer 202 wherein the via 208 is formed by mechanical drilling and through a hole-plugging process. Moreover, another insulative layers 210 and 212 made of materials such as epoxy or polyimide etc. are built up on the patterned circuit layers 204 and 206 respectively by a process such as coating. What is more, another two patterned circuit layers 214 and 216 are built up on the surfaces of the insulative layers 210 and 212 respectively and are electrically connected to the patterned circuit layers 204 and 206 respectively through micro vias 218 and 220. Normally, the patterned circuit layers 214 and 216 are made by first forming copper foil layers by the use of electric plating or electroless plating method, then being formed through the definition of photo-lithographic and etching process. As for the micro vias 218 and 220, they can be formed, for instance, by laser drilling. In addition, solder mask layers 222 and 224 are formed on the patterned circuit layers 214 and 216 respectively to expose a portion of the surface of the patterned circuit layers 214 and 216 to constitute terminals of the substrate 200 through the openings 226, 228 formed by definition. The material for the solder mask layers 222, 224 includes ultraviolet type green paint and thermoset type green paint while the method of coating the green paint includes roller coating, curtain coating, screen printing, dip, and dry film etc.

Figure 4:
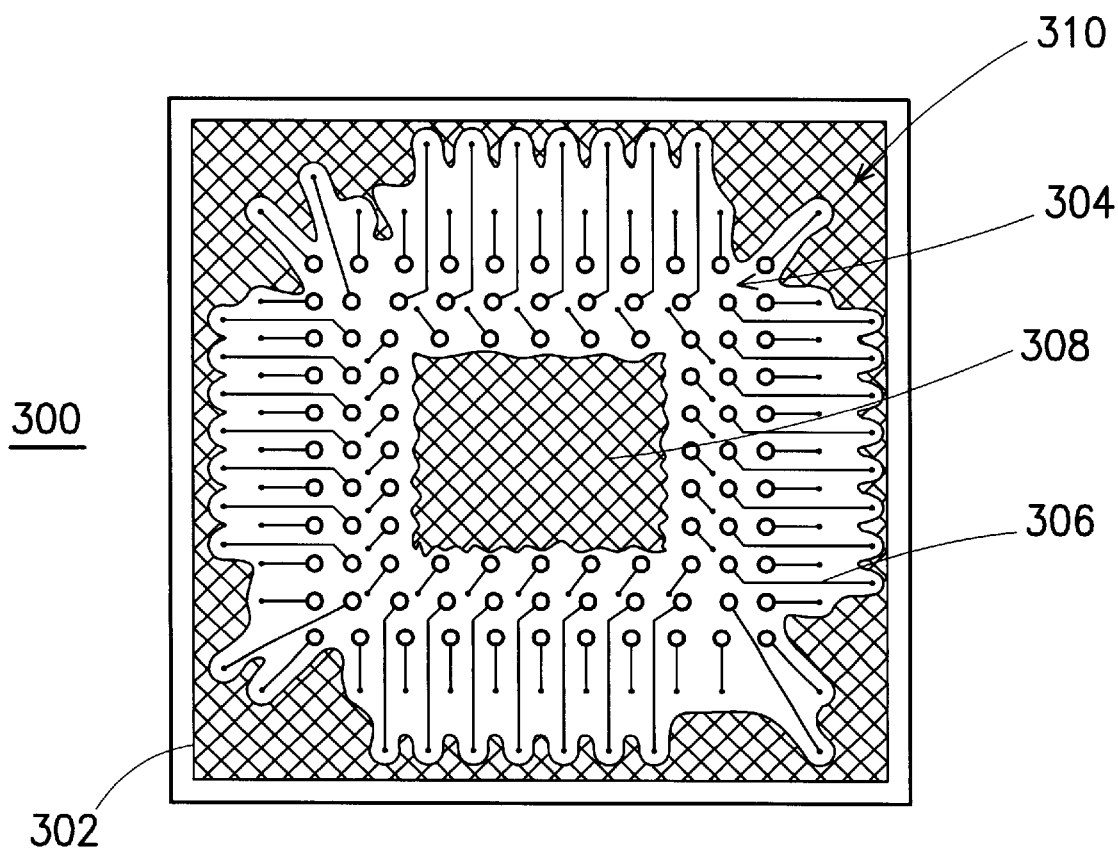
FIG. 4 is a plan view of the layout structure of the package substrate according to a preferred embodiment of the present invention.

FIG. 4 is a plan view of the layout structure of the package substrate according to a preferred embodiment of the present invention. In the current flip chip package substrate, generally, a patterned circuit layer is either a 1+2+1, or 2+2+2, or 3+2+3 layer-type of structure. The center two layers of the substrate, that is, the patterned circuit layers on both sides of the insulative core layer, are used for power source or ground layer. Therefore, the pattern density tends to be uniformly distributed, consequently, no planarity problem occurs. The layout structure for the other patterned circuit layer 302 of the package substrate 300 is mainly divided into a signal circuit region 304, a power/ground region 308, and the other region. The signal circuit region 304 constituted by a multiplicity of conductive traces 306 is used for signal transmission while the power/ground region 308 is used for connecting to the power source or to the ground. The other region of the patterned circuit layer 302 will form a dummy circuit region 310 for heat dissipation and protecting against electromagnetic interference.

Figure 1:
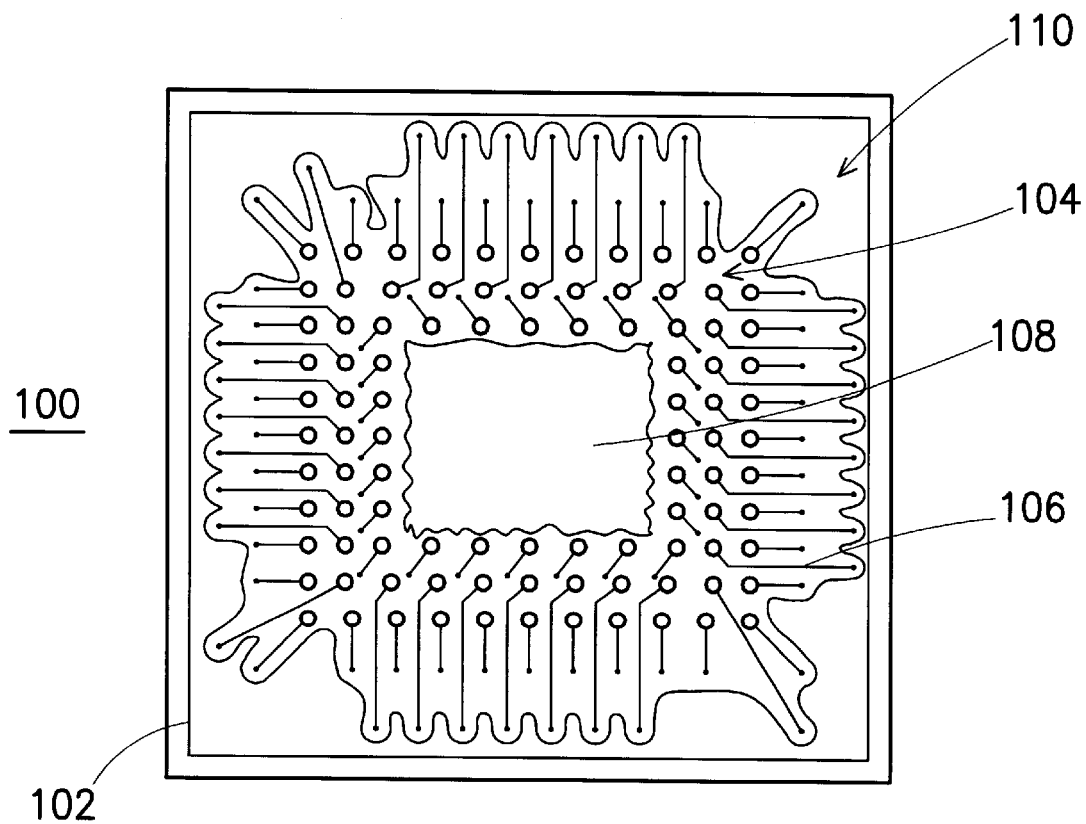
FIG. 1 is a plan view of the patterned circuit layer according to a prior art.
Figure 2:
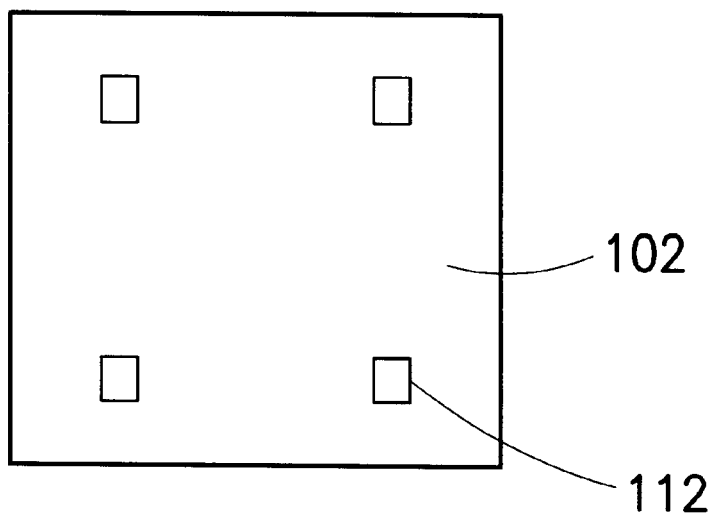
FIG. 2 is the enlarged drawing of the power/ground and the dummy pattern region corresponding to those in FIG. 1 according to the prior art.
Figure 5:
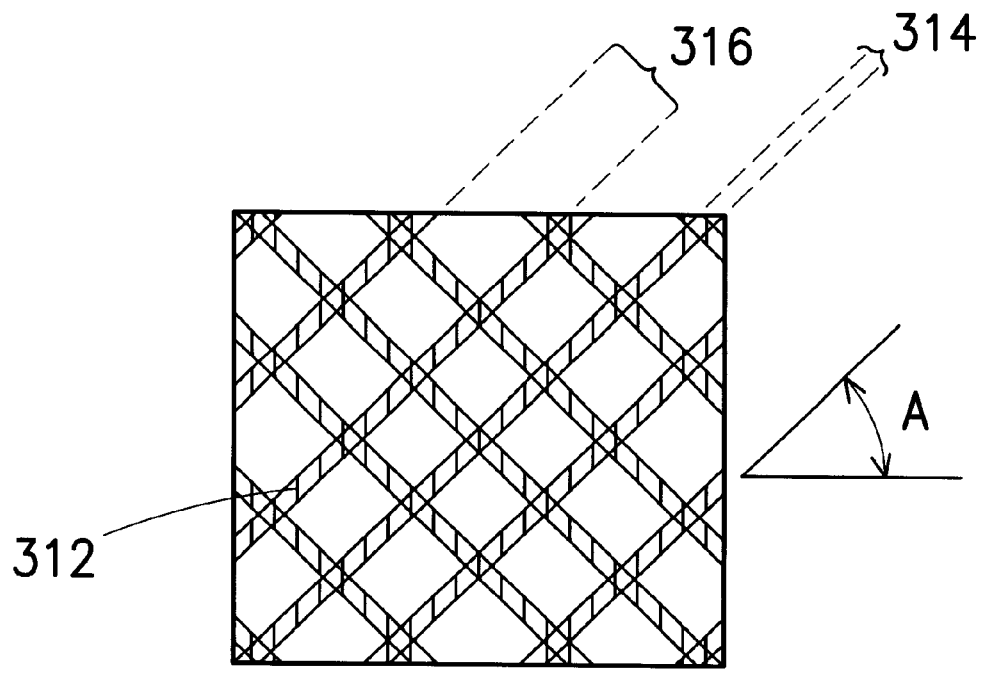
FIG. 5 is an enlarged drawing of the pattern of the power/ground region and the dummy circuit region shown in FIG. 4.

FIG. 5 is an enlarged drawing schematically showing the pattern of both power/ground region and dummy circuit region shown in FIG. 4. As shown in FIG. 5, the pattern of the power/ground region 308 and the dummy circuit region 310 employs a grid-type pattern that is constituted of a multiplicity of interlaced dummy traces 312. For example, the dummy traces 312 can be inclined at an angle A of 45 degrees. The trace width 314 of the dummy traces 312 is designed so as to be substantially equal to the trace width of the conductive traces 306 in the signal circuit region 304, for example, 40~100 µm. Also, the pitch of the dummy traces 312 is designed so as to be substantially equal to the pitch of the conductive traces 306 in the signal circuit region 304, for example, 50~150 µm. Hence, the pattern density, whether in the signal circuit region 304, the power/ground region 308, or the dummy circuit region 310, is very similar. The layout structure of the package substrate of the invention can therefore allow a pattern layout that is more uniformly distributed on the patterned circuit layer in comparison with the layout of the conventional patterned circuit layer. With the layout structure of the present invention, conventional non-planarity problem can be therefore substantially attenuated.

With a grid pattern design of dummy traces that is arranged in the power/ground region and the dummy circuit region, the thermal stress can be reduced, and the thermal stress of the bump in a subsequent flip chip packaging process can be further released effectively. Therefore, the reliability of the package substrate and the flip chip package can be improved. Besides, by improving the planarity of the circuit substrate, the layout structure of the present invention can facilitate the subsequent flip chip packaging process and, more particularly, can eliminate protrusions of the insulative layer subsequently coated. The process yield of the flip chip package is therefore improved and the under-filling process is facilitated. In addition, since the trace width, pitch, and the interweaving density of the grid pattern can be adjusted as desired, a negative impact of the grid pattern on heat dissipation and electromagnetic interference protecting function is very limited.

1. With a grid pattern design applied in the power/ground region and the dummy circuit region, the pattern density can be uniformly distributed. Therefore, the planarity of the patterned circuit layer of the circuit substrate can be improved. This contributes to improve the process yield and the product reliability in a subsequent packaging process.

2. The pattern layout structure for circuit substrate of the present invention, using a grid-like pattern, can prevent stress concentration, and improve the quality and reliability of the package substrate. It can also contribute to release the thermal stress of the bump in a subsequent flip chip package.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A substrate layout structure applied in a patterned circuit layer of a built-up substrate, wherein the patterned circuit layer comprises:

a signal circuit region comprised of a plurality of conductive traces;

a power/ground region, wherein the power/ground region includes a first grid-like pattern that is comprised of a plurality of first interlaced dummy traces; and a dummy circuit region positioned in a region other than the signal circuit region and the power/ground region of the patterned circuit layer, wherein the dummy circuit region includes a second grid-like pattern that is comprised of a plurality of second interlaced dummy traces, whereby a pattern density can be substantially similar in the signal circuit region, the power/ground region, and the dummy circuit region to obtain a relatively planar surface of the patterned circuit layer.

2. The substrate layout structure of claim 1, wherein the patterned circuit layer is formed by patterning a copper foil via photolithography and etching processes.

3. The substrate layout structure of claim 1, wherein the first and second grid patterns include a plurality of first and second dummy traces that are inclined at an angle of about 45 degrees.

4. The substrate layout structure of claim 1, wherein the pitch of the conductive traces is substantially equal to the pitch of the first dummy traces of the first grid pattern.

5. The substrate layout structure of claim 1, wherein the pitch of the conductive traces is substantially equal to the pitch of the second dummy traces of the second grid pattern.

6. The substrate layout structure of claim 1, wherein the built-up type substrate is a flip chip type of ball grid array package substrate.

7. A structure of package substrate comprising:

a plurality of patterned circuit layer; and at least an insulative layer disposed between and stacked up with the patterned circuit layers for isolating the patterned circuit layers, and is electrically connected to the patterned circuit layers, wherein at least one the patterned circuit layer further comprises:

a signal circuit region comprised of a plurality of conductive traces;

a power/ground region, wherein the power/ground region includes a first grid-like pattern that is comprised of a plurality of first interlaced dummy traces; and a dummy circuit region positioned in a region other than the signal circuit region and the power/ground region of the patterned circuit layer, wherein the dummy circuit region includes a second grid-like pattern that is comprised of a plurality of second interlaced dummy traces, whereby a pattern density can be substantially similar in the signal circuit region, the power/ground region, and the dummy circuit region to obtain a relatively planar surface of the patterned circuit layer.

8. The structure of package substrate of claim 7, wherein the patterned circuit layer is formed by patterning a copper foil via photolithography and etching processes.

9. The structure of package substrate of claim 7, wherein the material for the insulative layer is selected from the group consisting of "flame-retardant epoxy-glass fabric composite resin", Bismaleimide-Triazine (BT), epoxy, and polyimide.

10. The structure of package substrate of claim 7, wherein the first and second grid patterns include a plurality of first and second dummy traces that are inclined at an angle of about 45 degrees.

11. The structure of package substrate of claim 7, wherein the pitch of the conductive traces is substantially equal to the pitch of the first dummy traces of the first grid pattern.

12. The structure of package substrate of claim 7, wherein the pitch of the conductive traces is substantially equal to the pitch of the second dummy traces of the second grid pattern.

* * * * *